(12) United States Patent
Srivastava et al.

(10) Patent No.: US 6,501,100 B1
(45) Date of Patent: Dec. 31, 2002

(54) WHITE LIGHT EMITTING PHOSPHOR BLEND FOR LED DEVICES

(75) Inventors: Alok Mani Srivastava, Niskayuna, NY (US); Holly Ann Comanzo, Niskayuna, NY (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 09/571,379

(22) Filed: May 15, 2000

(51) Int. Cl.$^7$ .............................................. H01L 27/15
(52) U.S. Cl. ............................ 257/79; 257/80; 257/81; 257/98; 257/100; 257/103; 313/463; 313/467; 313/468; 313/501; 313/502; 313/505
(58) Field of Search ............................. 257/79, 80, 81, 257/98, 100, 103

(56) References Cited

U.S. PATENT DOCUMENTS

| | | | |
|---|---|---|---|
| 4,661,419 A | 4/1987 | Nakamura | 428/691 |
| 5,198,679 A | 3/1993 | Katoh et al. | 250/484.1 |
| 5,571,451 A | 11/1996 | Srivastava et al. | 252/301.4 |
| 5,813,753 A | 9/1998 | Vriens et al. | 362/293 |
| 5,838,101 A | * 11/1998 | Pappalardo | 313/487 |
| 5,847,507 A | 12/1998 | Butterworth et al. | 313/512 |
| 5,851,063 A | 12/1998 | Doughty et al. | 362/231 |
| 5,925,897 A | 7/1999 | Oberman | 257/80 |
| 5,966,393 A | 10/1999 | Hide et al. | 372/23 |
| 5,998,925 A | 12/1999 | Shimizu et al. | 313/503 |
| 6,066,861 A | 5/2000 | Höhn et al. | 257/99 |
| 6,069,440 A | 5/2000 | Shimizu et al. | 313/486 |
| 6,084,250 A | 7/2000 | Justel et al. | 257/89 |

OTHER PUBLICATIONS

"Physics of semiconductor Devices" by S. M. Sze (1981) published by John Wiley & Son, 2$^{nd}$ Edition, p. 683.*
G. Blasse et al: "Fluorescence of Eu$^{2+}$–Activated Silicates," Phillips Res. Repts., 1968, pp. 189–200, vol. 23.

G. Blasse et al: "Fluorescence of Eu$^{2+}$–Acivated Alkaline–Earth Aluminates," Phillips Res. Repts., 1968, pp. 201–206, vol. 23.

Chisato Furukawa, "Semiconductor Light–Emitting Device," Patent Abstracts of Japan, 2000–183408, Jun. 30, 2000, (Abstact Only).

Keith Butler: Fluorescent Lamp Phosphors, pp. 98–107 (The Pennsylvania State University Press 1980).

S. Nakamura et al.: The Blue Laser Diode, pp. 216–221, 328–329 ( Springer 1997).

G. Blasse et al.: Luminescent Materials, pp. 109–110 ( Springer–Verlag 1994).

S. Shinoya et al.: "Phosphor Handbook," 168–170, 317–330, 343–349, 389–410, 412–417, 419–431, 555, 623–636 (1999).

* cited by examiner

Primary Examiner—Olik Chaudhuri
Assistant Examiner—Wai-Sing Lowe
(74) Attorney, Agent, or Firm—Foley & Lardner

(57) ABSTRACT

There is provided a white light illumination system including a radiation source, a first luminescent material having a peak emission wavelength of about 570 to about 620 nm, and a second luminescent material having a peak emission wavelength of about 480 to about 500 nm, which is different from the first luminescent material. The LED may be a UV LED and the luminescent materials may be a blend of two phosphors. The first phosphor may be an orange emitting Eu$^{2+}$, Mn$^{2+}$ doped strontium pyrophosphate, $(Sr_{0.8}Eu_{0.1}Mn_{0.1})_2P_2O_7$. The second phosphor may be a blue-green emitting Eu$^{2+}$ doped SAE, $(Sr_{0.90-0.99}Eu_{0.01-0.1})_4Al_{14}O_{25}$. A human observer perceives the combination of the orange and the blue-green phosphor emissions as white light.

14 Claims, 6 Drawing Sheets

WHITE LIGHT EMITTING PHOSPHOR BLEND FOR LED DEVICES

BACKGROUND OF THE INVENTION

This invention relates generally to a white light illumination system, and specifically to a ceramic phosphor blend for converting UV radiation emitted by a light emitting diode ("LED") to white light.

White light emitting LEDs are used as a backlight in liquid crystal displays and as a replacement for small conventional lamps and fluorescent lamps. As discussed in chapter 10.4 of "The Blue Laser Diode" by S. Nakamura et al., pages 216–221 (Springer 1997), incorporated herein by reference, white light LEDs are fabricated by forming a ceramic phosphor layer on the output surface of a blue light emitting semiconductor LED. Conventionally, the blue LED is an InGaN single quantum well LED and the phosphor is a cerium doped yttrium aluminum garnet ("YAG:Ce"), $Y_3Al_5O_{12}:Ce^{3+}$. The blue light emitted by the LED excites the phosphor, causing it to emit yellow light. The blue light emitted by the LED is transmitted through the phosphor and is mixed with the yellow light emitted by the phosphor. The viewer perceives the mixture of blue and yellow light as white light.

However, the blue LED—YAG:Ce phosphor white light illumination system suffers from the following disadvantages. The LED color output (e.g., spectral power distribution and peak emission wavelength) varies with the band gap width of the LED active layer and with the power applied to the LED. During production, a certain percentage of LEDs are manufactured with active layers whose actual band gap width is larger or smaller than the desired width. Thus, the color output of such LEDs deviates from the desired parameters. Furthermore, even if the band gap of a particular LED has the desired width, during LED operation the power applied to the LED frequently deviates from the desired value. This also causes the LED color output to deviate from the desired parameters. Since the light emitted by the system contains a blue component from the LED, if the color output of the LED deviates from the desired parameters, then the light output by the system deviates form the desired parameters as well. A significant deviation from the desired parameters may cause the color output of the system to appear non-white (i.e., bluish or yellowish).

Furthermore, the color output of the blue LED—YAG:Ce phosphor system varies greatly due to frequent, unavoidable, routine deviations from desired parameters (i.e., manufacturing systematic variations) during the production of the LED lamp because the color output of the blue LED—YAG:Ce phosphor system is very sensitive to the thickness of the phosphor. If the phosphor is too thin, then more than a desired amount of the blue light emitted by the LED will penetrate through the phosphor, and the combined LED—phosphor system light output will appear bluish, because it is dominated by the output of the blue LED. In contrast, if the phosphor is too thick, then less than a desired amount of the blue LED light will penetrate through the thick YAG:Ce phosphor layer. The combined LED—phosphor system will then appear yellowish, because it is dominated by the yellow output of the YAG:Ce phosphor.

Therefore, the thickness of the phosphor is a critical variable affecting the color output of the prior art system. Unfortunately, it is difficult to control the precise thickness of the phosphor during large scale production of the blue LED—YAG:Ce phosphor system. Variations in phosphor thickness often result in the system output being unsuitable for white light illumination applications, causing the color output of the system to appear non-white (i.e., bluish or yellowish), which leads to an unacceptably low blue LED—YAG:Ce phosphor system manufacturing yield.

The blue LED—YAG:Ce phosphor system also suffers from the halo effect due to the separation of blue and yellow light. The LED emits blue light in a directional fashion. However, the phosphor emits yellow light isotropically (i.e., in all directions). Therefore, when the light output by the system is viewed straight on (i.e., directly at the LED emission), the light appears bluish-white. In contrast, when the light output is viewed at an angle, the light appears yellowish due to the predominance of the yellow phosphor emission. When the light output by such a system is directed onto a flat surface, it appears as a yellowish halo surrounding a bluish area. The present invention is directed to overcoming or at least reducing the problems set forth above.

BRIEF SUMMARY OF THE INVENTION

In accordance with one aspect of the present invention, there is provided a white light illumination system comprising a radiation source, a first luminescent material having a peak emission wavelength of about 570 to about 620 nm, and a second luminescent material having a peak emission wavelength of about 480 to about 500 nm, which is different from the first luminescent material.

In accordance with another aspect of the present invention, there is provided a white light illumination system comprising a light emitting diode having a peak emission wavelength between 370 and 405 nm, a first APO:$Eu^{2+}$, $Mn^{2+}$ phosphor, where A comprises at least one of Sr, Ca, Ba or Mg, and a second phosphor selected from at least one of:

a) $A_4D_{14}O_{25}:Eu^{2+}$, where A comprises at least one of Sr, Ca, Ba or Mg, and D comprises at least one of Al or Ga;

b) $(2AO*0.84P_2O_5*0.16B_2O_3): Eu^{2+}$, where A comprises at least one of Sr, Ca, Ba or Mg;

c) $AD_8O_{13}:Eu^{2+}$, where A comprises at least one of Sr, Ca, Ba or Mg, and D comprises at least one of Al or Ga;

d) $A_{10}(PO_4)_6Cl_2:Eu^{2+}$, where A comprises at least one of Sr, Ca, Ba or Mg; or e) $A_2Si_3O_8*2ACl_2:Eu^{2+}$, where A comprises at least one of Sr, Ca, Ba or Mg.

In accordance with another aspect of the present invention, there is provided a method of making a white light illumination system, comprising blending a first phosphor powder having a peak emission wavelength of about 570 to about 620 nm and a second phosphor powder having a peak emission wavelength of about 480 to about 500 nm to form a phosphor powder mixture, and placing the phosphor powder mixture into the white light illumination system adjacent a radiation source.

DETAILED DESCRIPTION OF THE INVENTION

Figure 1:
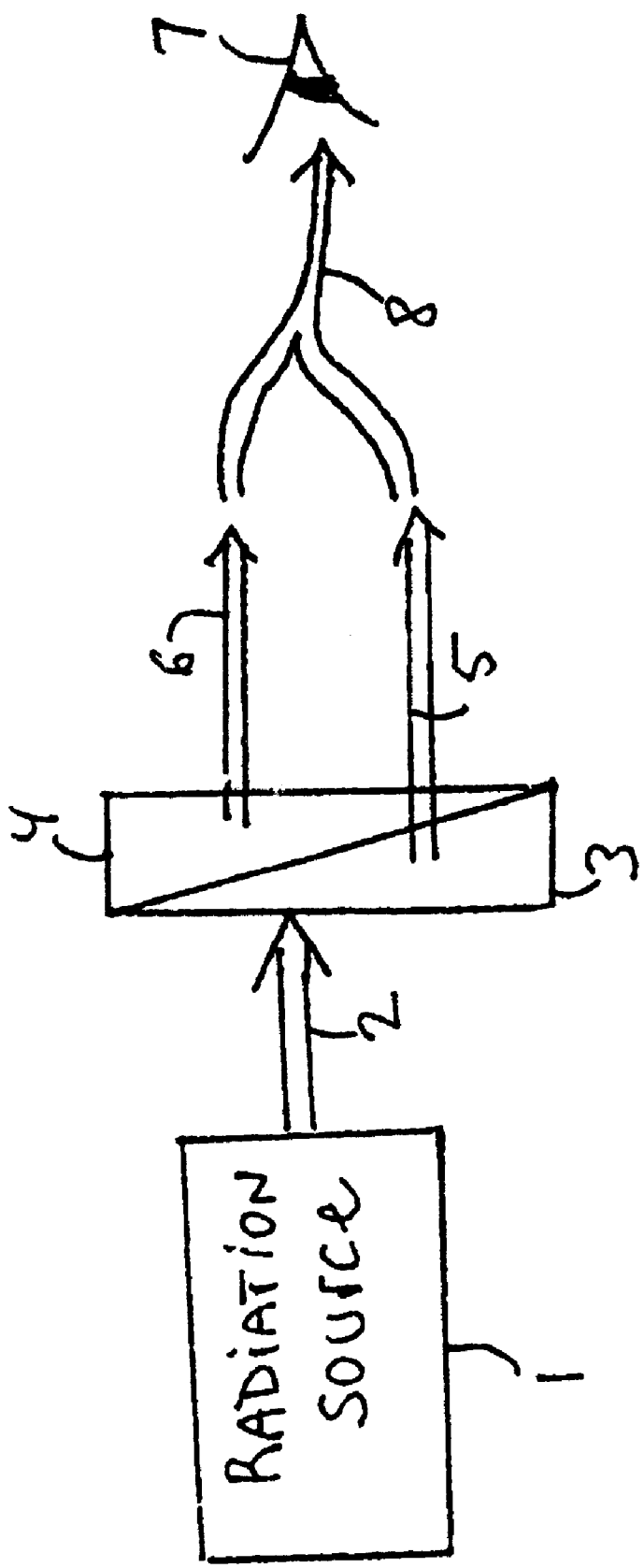
FIG. 1 is schematic illustration of a white light illumination system according to one embodiment of the present invention.

In view of the problems in the prior art, it is desirable to obtain a white light illumination system whose color output is less sensitive to variations during system operation and manufacturing process, such as due to variations in the LED power, the width of the LED active layer band gap and the thickness of the luminescent material. The present inventors have discovered that a color output of the radiation source—luminescent material system is less sensitive to these variations if the color output of the system does not include significant visible radiation emitted by the radiation source, such as an LED. In this case, the color output of the system does not vary significantly with the LED power, band gap width and the luminescent material thickness. The term luminescent material includes a luminescent material in loose or packed powder form (a phosphor) and in solid crystalline body form (scintillator).

The color output of the system does not vary significantly with the thickness of the luminescent material if the white light emitted by the system lacks any significant visible component emitted by the radiation source, such as the LED. Therefore, the amount of transmission of the LED radiation through the luminescent material, such as a phosphor, does not affect the color output of the system. This can be achieved in at least two ways.

One way to avoid affecting the color output of the system is by using a radiation source that emits radiation in a wavelength that is not visible to the human eye. For example, an LED may be constructed to emit ultraviolet (UV) radiation having a wavelength of 380 nm or less that is completely not visible to the human eye. Furthermore, the human eye is not very sensitive to UV radiation having a wavelength between 380 and 400 nm and to violet light having a wavelength between 400 and 420 nm. Therefore, the radiation emitted by the LED having a wavelength of 420 nm or less would not substantially affect the color output of the LED—phosphor system irrespective of whether the emitted LED radiation is transmitted through the phosphor or not, because radiation having a wavelength of about 420 nm or less is not significantly visible to a human eye.

The second way to avoid affecting the color output of the system is by using a thick luminescent material which does not allow the radiation from the radiation source to pass through it. For example, if the LED emits visible light between 420 and 650 nm, then in order to ensure that the phosphor thickness does not affect the color output of the system, the phosphor should be thick enough to prevent any significant amount of visible light emitted by the LED from penetrating through the phosphor. However, while this way to avoid affecting the color output of the system is possible, it is not preferred because it lowers the output efficiency of the system.

In both cases described above, the color of the visible light emitted by the system is solely dependent on the type of luminescent material used. Therefore, in order for the LED—phosphor system to emit white light, the phosphor should emit white light when it is irradiated by the LED radiation.

The present inventors have discovered that a when a first orange emitting phosphor having a peak emission wavelength between about 570 and about 620 nm and a second blue-green emitting phosphor having a peak emission wavelength between about 480 and about 500 nm are used together, a human observer perceives their combined emission as white light. Any luminescent materials, such as phosphors having peak emission wavelengths between 570 and 620 nm and between 480 and 500 nm may be used in combination with a radiation source to form the white light illumination system. Preferably, the luminescent materials have a high quantum efficiency at a particular emission wavelength of the radiation source. Furthermore, each luminescent material is preferably transparent to the visible light wavelengths emitted by the other luminescent material.

FIG. 1 schematically illustrates the above principle. In FIG. 1, a radiation source 1, such as an LED, emits radiation 2 incident on two luminescent materials, such as a first phosphor 3 and second phosphor 4. The two phosphors 3, 4 are separated by a schematic diagonal line in FIG. 1 to indicate the two phosphors may be blended together or that the two phosphors may comprise discrete overlying layers. The diagonal line is used for definitional purposes only and not to indicate a mandatory diagonal boundary between the phosphors.

The radiation 2 may have a wavelength to which the human eye is not sensitive, such as 420 nm and below. Alternatively, the phosphors 3, 4 may be too thick to allow the radiation 2 to penetrate to the other side. After absorbing the incident radiation 2, the first phosphor 3 emits orange light 5 having a peak emission wavelength between 570 and 620 nm, while the second phosphor 4 emits blue-green light 6 having a peak emission wavelength between 480 and 500 nm. The human observer 7 perceives the combination of orange 5 and blue-green 6 light as white light 8. FIG. 1 schematically illustrates that orange light 5 and blue-green light 6 emanates from discrete phosphor areas to illustrate the concept of color mixing. However, it should be understood that the entire phosphor 3 emits light 5 and that the entire phosphor 4 emits light 6. Both orange light 5 and blue-green light 6 may be emitted from the same area if the first and second phosphors 3, 4 are blended together to form a single blended phosphor layer.

The radiation source 1 may comprise any radiation source capable of causing an emission from the first 3 and second 4 phosphors. Preferably, the radiation source 1 comprises an LED. However, the radiation source 1 may also comprise a gas, such as mercury in a fluorescent lamp or high pressure mercury vapor lamp, or a noble gas, such as Ne, Ar and/or Xe in a plasma display.

For example, the radiation source 1 may comprise any LED which causes the first 3 and second 4 phosphor to emit radiation 8 which appears white to the human observer 7 when the radiation 2 emitted by the LED is directed onto the first 3 and second 4 phosphors. Thus, the LED may comprise a semiconductor diode based on any suitable III–V, II–VI or IV—IV semiconductor layers and having an emission wavelength of 360 to 420 nm. For example, the LED may contain at least one semiconductor layer based on GaN, ZnSe or SiC semiconductors. The LED may also contain one or more quantum wells in the active region, if desired. Preferably, the LED active region may comprise a p-n junction comprising GaN, AlGaN and/or InGaN semiconductor layers. The p-n junction may be separated by a thin undoped InGaN layer or by one or more InGaN quantum wells. The LED may have an emission wavelength between 360 and 420 nm, preferably between 370 and 405 nm, most preferably between 370 and 390 nm. However, an LED with an emission wavelength above 420 nm may be used with a thick phosphor, whose thickness prevents the light emitted from the LED from penetrating through the phosphor. For example the LED may have the following wavelengths: 370, 375, 380, 390 or 405 nm.

The radiation source 1 of the white light illumination system has been described above as a semiconductor light emitting diode. However, the radiation source of the present invention is not limited to a semiconductor light emitting diode. For example, the radiation source may comprise a laser diode or an organic light emitting diode (OLED). The preferred white light illumination system described above contains a single radiation source 1. However, if desired, plural radiation sources may be used in the system in order to improve the emitted white light or to combine the emitted white light with a light of a different color(s). For example, the white light emitting system may be used in combination with red, green and/or blue light emitting diodes in a display device.

The first luminescent material may be any phosphor 3, which in response to the incident radiation 2 from the radiation source 1, emits visible light having a peak emission wavelength between 570 and 620 nm. If the radiation source 1 comprises an LED having a peak emission wavelength between 360 and 420 nm, then the first phosphor 3 preferably comprises APO:$Eu^{2+}$,$Mn^{2+}$ where A comprises at least one of Sr, Ca, Ba or Mg. Most preferably, the first phosphor 3 comprises a europium and manganese doped alkaline earth pyrophosphate phosphor, $A_2P_2O_7$:$Eu^{2+}$,$Mn^{2+}$, which may be written as $(A_{1-x-y}Eu_xMn_y)_2P_2O_7$, where A comprises at least one of Sr, Ca, Ba or Mg, $0<x \leq 0.2$, and $0<y<0.2$. Preferably, A comprises strontium. This phosphor is preferred for an LED radiation source because this phosphor emits visible light having a peak emission wavelength between 575 and 595 nm and because it has a high efficacy and high quantum efficiency for incident radiation having a peak wavelength between 360 and 420 nm, such as that emitted by an LED. Alternatively, the first phosphor may comprise $A_3P_2O_8$:$Eu^{2+}$,$Mn^{2+}$, where A comprises at least one of Sr, Ca, Ba or Mg.

In the $Eu^{2+}$ and $Mn^{2+}$ doped alkaline earth pyrophosphate phosphor, the Eu ions generally act as sensitizers and Mn ions generally act as activators. Thus, the Eu ions absorb the incident energy (i.e., photons) emitted by the radiation source and transfer the absorbed energy to the Mn ions. The Mn ions are promoted to an excited state by the absorbed transferred energy and emit a broad radiation band having a peak wavelength that varies from about 575 to 595 nm depending on processing conditions.

The second luminescent material may be any phosphor 4, which in response to the incident radiation 2 from the radiation source 1, emits visible light having a peak emission wavelength between 480 and 500 nm. If the radiation source 1 comprises an LED having a peak emission wavelength between 360 and 420 nm, then the second phosphor may comprise any commercially available phosphor having the peak emission wavelength between 480 and 500 nm and a high efficacy and quantum efficiency for incident radiation having a peak wavelength between 370 and 420 nm. For example, the following five phosphors fit this criteria:

a) $A_4D_{14}O_{25}$:$Eu^{2+}$, where A comprises at least one of Sr, Ca, Ba or Mg, and D comprises at least one of Al or Ga;

b) $(2AO*0.84P_2O_5*0.16B_2O_3)$: $Eu^{2+}$, where A comprises at least one of Sr, Ca, Ba or Mg;

c) $AD_8O_{13}$:$Eu^{2+}$, where A comprises at least one of Sr, Ca, Ba or Mg, and D comprises at least one of Al or Ga;

d) $A_{10}(PO_4)_6Cl_2$:$Eu^{2+}$, where A comprises at least one of Sr, Ca, Ba or Mg; or e) $A_2Si_3O_8*2ACl_2$:$Eu^{2+}$, where A comprises at least one of Sr, Ca, Ba or Mg.

The preferred, commercially available compositions for the above five phosphors are:

a) $Sr_4Al_{14}O_{25}$:$Eu^{2+}$ (also known as the SAE phosphor);

b) $(2SrO*0.84P_2O_5*0.16B_2O_3)$: $Eu^{2+}$;

c) $BaAl_8O_{13}$:$Eu^{2+}$;

d) $(Sr,Mg,Ca)_{10}(PO_4)_6Cl_2$:$Eu^{2+}$; or e) $Sr_2Si_3O_8*2SrCl_2$:$Eu^{2+}$.

These phosphors, having peak emission wavelengths ranging from 480 to 493 nm, are described on pages 389–432 of the *Phosphor Handbook*, Edited by S. Shionoya and W. M. Yen, CRC Press, (1987, 1999), incorporated herein by reference. Therefore, the second phosphor 4 may comprise one or more of phosphors a) to e) in any combination. The SAE phosphor is preferred because it has a quantum efficiency of at least 90% for incident radiation having a wavelength of 340 to 400 nm and has little or no selective absorption of the visible light.

However, other phosphors having a peak emission wavelengths between 570 and 620 nm or between 480 and 500 nm may be used instead of or in addition to the phosphors described above. For example, for radiation sources other than LEDs, phosphors that have a high efficacy and high quantum efficiency for incident radiation having a peak wavelength of 254 nm and 147 nm, may be used for fluorescent lamp and plasma display applications, respectively. The mercury gas emission in a fluorescent lamp has a peak emission wavelength of 254 nm and Xe plasma discharge in a plasma display has a peak emission wavelength of 147 nm.

According to a preferred aspect of the present invention, the first phosphor 3 and the second phosphor 4 are interspersed. Most preferably, the first phosphor 3 and the second phosphor 4 are blended together to form a uniform blend. The amount of each phosphor in the blend depends on the type of phosphor and the type of radiation source used. However, the first 3 and the second 4 phosphors should be blended such that the combination 8 of the emission 5 from the first phosphor 3 and the emission 6 from the second phosphor 4 appears white to a human observer 7.

Alternatively, the first and second phosphors 3, 4 may comprise discrete layers formed over the radiation source 1. However, the upper phosphor layer should be substantially transparent to the radiation emitted by the lower phosphor. Furthermore, one of the two phosphors 3, 4 may comprise discrete particles embedded in the other phosphor layer. If desired, one or both of the first 3 and second 4 phosphors may be replaced by a single crystal scintillator having peak emission wavelengths between 570 and 620 nm and/or between 480 and 500 nm.

According to the first preferred embodiment of the present invention, the first and second phosphor powders are placed into a white light illumination system containing an LED radiation source. The white light illumination system according to the preferred aspect of the present invention may have various different structures.

Figure 2:
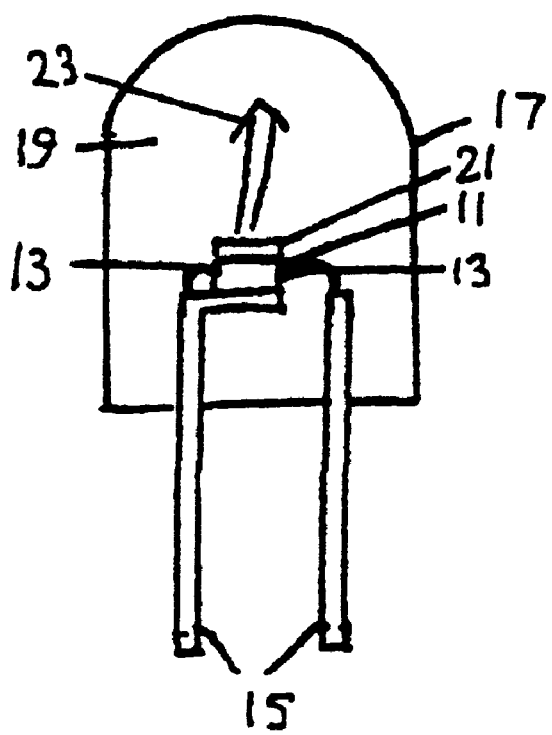
FIGS. 2–4 are cross-sectional schematic views of illumination systems using an LED according to the first preferred embodiment of the present invention.

The first preferred structure is schematically illustrated in FIG. 2. The illumination system includes a light emitting diode chip 11 and leads 13 electrically attached to the LED chip. The leads 13 may comprise thin wires supported by a thicker lead frame(s) 15 or the leads may comprise self supported electrodes and the lead frame may be omitted. The leads 13 provide current to the LED chip 11 and thus cause the LED chip 11 to emit radiation.

The LED chip 11 is encapsulated within a shell 17 which encloses the LED chip and an encapsulant material 19. The encapsulant material preferably comprises a UV resistant epoxy. The shell 17 may be, for example, glass or plastic. The encapsulant material may be, for example, an epoxy or a polymer material, such as silicone. However, a separate shell 17 may be omitted and the outer surface of the encapsulant material 19 may comprise the shell 17. The LED chip 11 may be supported, for example, by the lead frame 15, by the self supporting electrodes, the bottom of the shell 17 or by a pedestal mounted to the shell or to the lead frame.

The first preferred structure of the illumination system includes a phosphor layer 21 comprising the first phosphor 3 and second phosphor 4. The phosphor layer 21 may be formed over or directly on the light emitting surface of the LED chip 11 by coating and drying a suspension containing the first 3 and second 4 phosphor powders over the LED chip 11. After drying, the phosphor powders 3, 4 form a solid phosphor layer or coating 21. Both the shell 17 and the encapsulant 19 should be transparent to allow white light 23 to be transmitted through those elements. The phosphor emits white light 23 which comprises the orange light 5 emitted by the first phosphor 3 and the blue-green light 6 emitted by the second phosphor 4.

Figure 3:
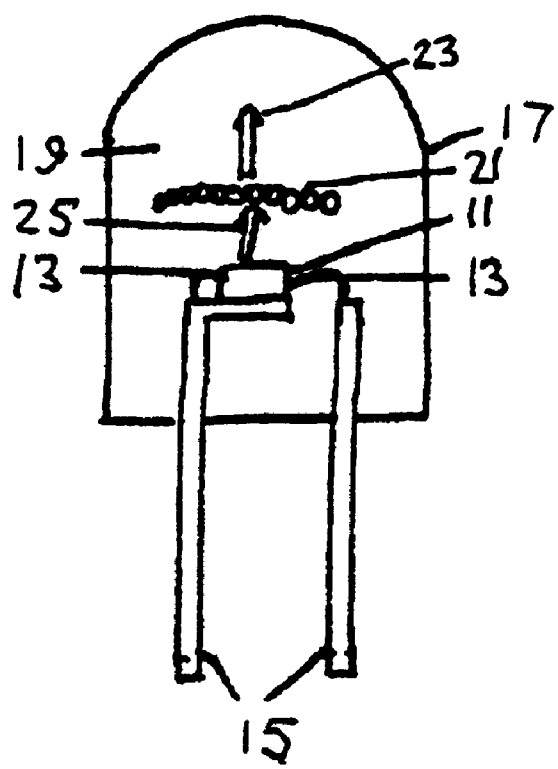

FIG. 3 illustrates a second preferred structure of the system according to the first preferred embodiment of the present invention. The structure of FIG. 3 is the same as that of FIG. 2, except that the first 3 and second 4 phosphor powders are interspersed within the encapsulant material 19, instead of being formed over the LED chip 11. The first 3 and second 4 phosphor powders may be interspersed within a single region of the encapsulant material 19 or throughout the entire volume of the encapsulant material. The phosphor powders are interspersed within the encapsulant material, for example, by adding the powders to a polymer precursor, and then curing the polymer precursor to solidify the polymer material. Alternatively, the phosphor powders may be mixed in with the epoxy encapsulant. Other phosphor interspersion methods may also be used. The first phosphor powder 3 and the second phosphor powder 4 may be premixed prior to adding a mix of these powders 3, 4 to the encapsulant material 19 or the phosphor powders 3, 4 may be added to the encapsulant material 19 separately. Alternatively, a solid phosphor layer 21 comprising the first and second phosphors 3, 4 may be inserted into the encapsulant material 19 if desired. In this structure, the phosphor layer 21 absorbs the radiation 25 emitted by the LED and in response, emits white light 23.

Figure 4:
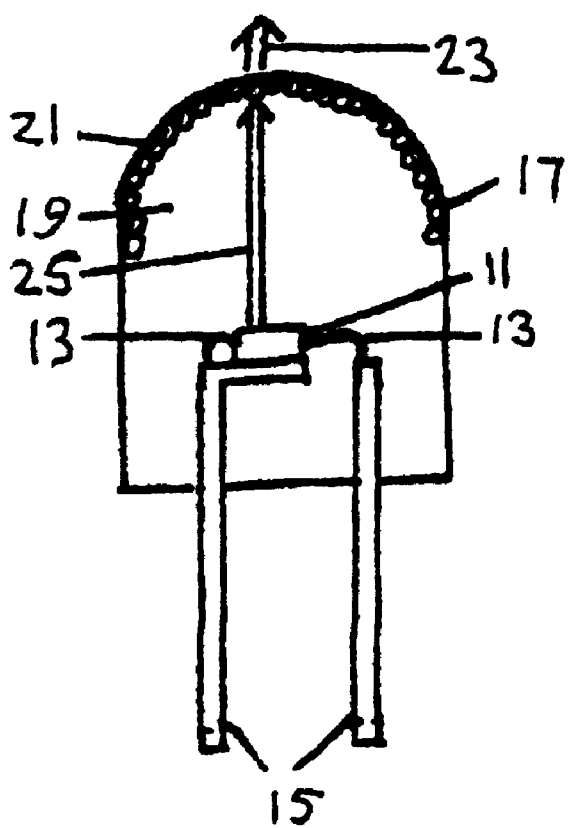

FIG. 4 illustrates a third preferred structure of the system according to the first preferred embodiment of the present invention. The structure of FIG. 4 is the same as that of FIG. 2, except that the phosphor layer 21 containing the first and second phosphors 3, 4 is formed on the shell 17, instead of being formed over the LED chip 11. The phosphor layer 21 is preferably formed on the inside surface of the shell 17, although the phosphor layer 21 may be formed on the outside surface of the shell, if desired. The phosphor layer 21 may be coated on the entire surface of the shell or only a top portion of the surface of the shell 17.

Of course, the embodiments of FIGS. 2–4 may be combined and the phosphor may be located in any two or all three locations or in any other suitable location, such as separately from the shell or integrated into the LED.

Figure 5:
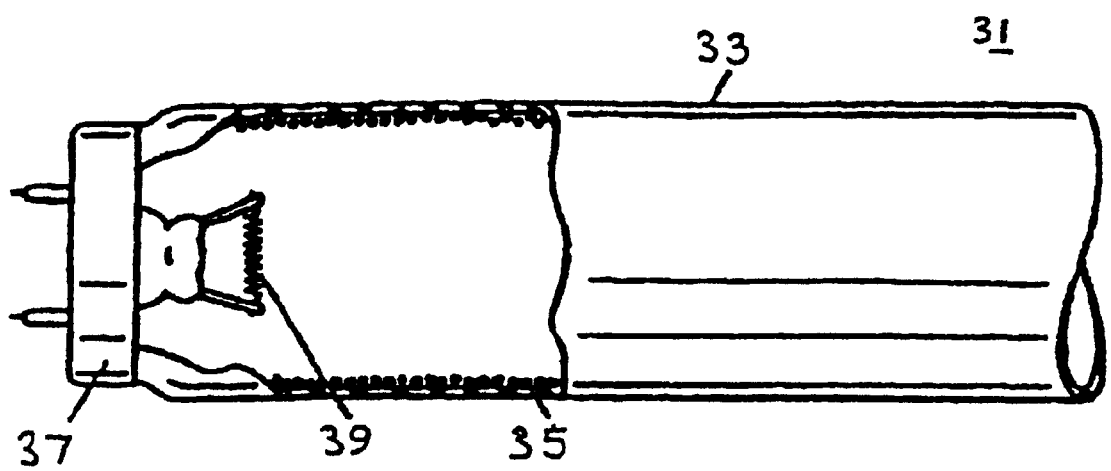
FIG. 5 is a cross-sectional schematic view of an illumination system using a fluorescent lamp according to the second preferred embodiment of the present invention.

According to the second preferred embodiment of the present invention, the first and the second phosphor powders 3, 4 are placed into a white light illumination system containing a fluorescent lamp radiation source. A portion of a fluorescent lamp is schematically illustrated in FIG. 5. The lamp 31 contains a phosphor coating 35 comprising the first 3 and second 4 phosphors on a surface of the lamp cover 33, preferably the inner surface. The fluorescent lamp 31 also preferably contains a lamp base 37 and a cathode 39. The lamp cover 33 encloses a gas, such as mercury, which emits UV radiation in response to a voltage applied to the cathode 39.

Figure 6:
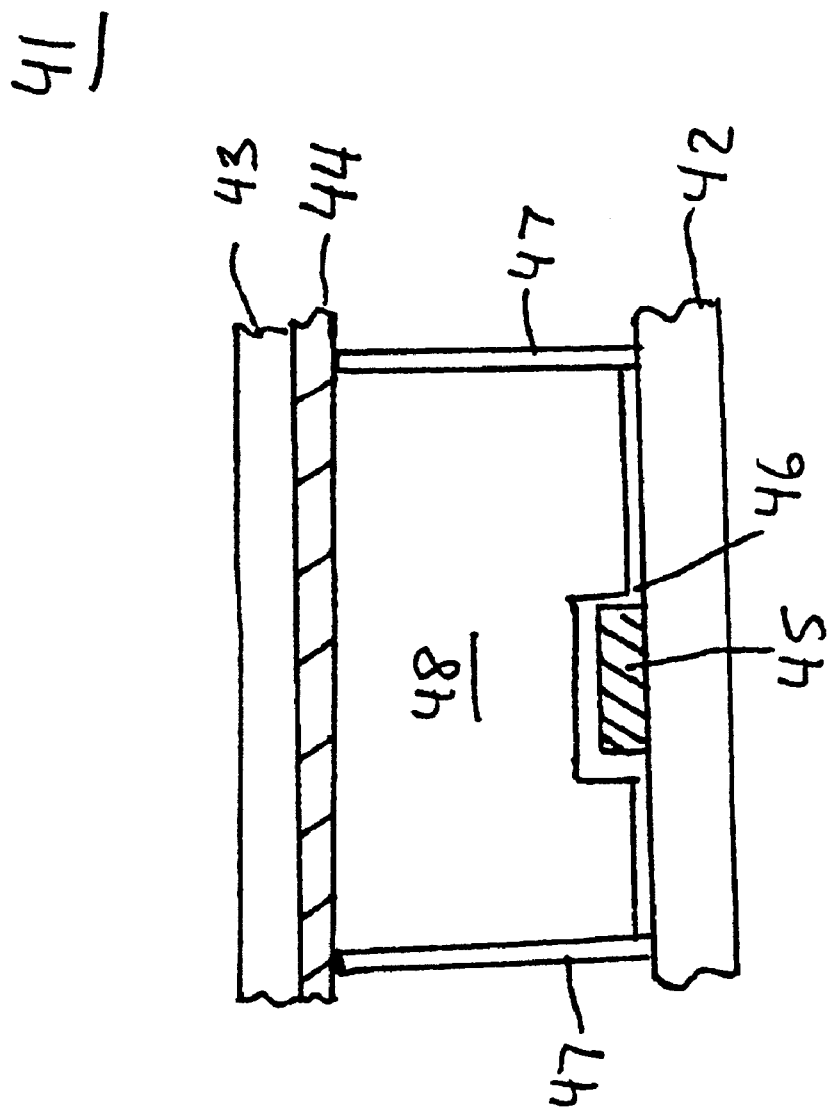
FIG. 6 is a cross-sectional schematic view of an illumination systems using a plasma display according to the third preferred embodiment of the present invention.

According to the third preferred embodiment of the present invention, the first 3 and the second 4 phosphor powders are placed into a white light illumination system containing a plasma display device. Any plasma display device, such as an AC or a DC plasma display panel may be used, such as the devices described on pages 623–639 of the *Phosphor Handbook*, Edited by S. Shionoya and W. M. Yen, CRC Press, (1987, 1999), incorporated herein by reference. FIG. 6 schematically illustrates one cell of a DC plasma display device 41. The cell contains a first glass plate 42, a second glass plate 43, at least one cathode 44, at least one anode 45, a phosphor layer 46 comprising the first 3 and the second 4 phosphors, barrier ribs 47 and a noble gas space 48. In an AC plasma display device, an extra dielectric layer is added between the cathode and the gas space 48. An application of a voltage between the anode 45 and the cathode 44 causes the noble gas in space 48 to emit short wavelength vacuum ultraviolet radiation (VUV), which excites the phosphor layer 46 causing it to emit white light.

The individual phosphors 3 and 4 may be made, for example, by any ceramic powder method, such as a wet chemical method or a solid state method. Preferably, the method of making the first phosphor 3 comprising europium and manganese doped strontium pyrophosphate phosphor comprises the following steps.

First, the starting compounds of the first phosphor material are manually blended or mixed in a crucible or mechanically blended or mixed in another suitable container, such as a ball mill, to form a starting powder mixture. The starting compounds may comprise any oxide, phosphate, hydroxide, oxalate, carbonate and/or nitrate starting phosphor compound. The preferred starting phosphor compounds comprise strontium hydrogen phosphate, $SrHPO_4$, manganese carbonate $MnCO_3$, europium oxide, $Eu_2O_3$, and ammonium hydrogen phosphate $(NH_4)HPO_4$ powders. The $(NH_4)HPO_4$ powder is preferably added in an amount comprising 2% in excess of the stoichiometric ratio per mole of the first phosphor produced. A small excess of the Sr compound may also be added if desired. Calcium, barium and magnesium starting compounds may also be added if it is desired to substitute some or all of the strontium with calcium, barium and/or magnesium.

The starting powder mixture is then heated in air at about 300 to 800° C. for about 1–5 hours, preferably at 600° C. The resulting powder is then re-blended and subsequently fired in a reducing atmosphere at about 1000 to 1250° C., preferably 1000° C., to form a calcined phosphor body or cake. Preferably the starting powder mixture is calcined in a furnace in an atmosphere comprising nitrogen and 0.1 to 10% hydrogen for four to ten hours, preferably eight hours, and subsequently cooled in the same atmosphere by turning off the furnace.

The solid calcined phosphor body may be converted to a first phosphor powder 3 in order to easily coat the phosphor powder on a portion of the white light illumination system. The solid phosphor body may be converted to the first phosphor powder by any crushing, milling or pulverizing method, such as wet milling, dry milling, jet milling or crushing. Preferably, the solid body is wet milled in propanol, methanol and/or water, and subsequently dried.

The second phosphor 4 may be selected from any combination of one or more of the following five phosphors:

a) $A_4D_{14}O_{25}:Eu^{2+}$, preferably $Sr_4Al_{14}O_{25}:Eu^{2+}$ ("SAE");
b) $(2AO*0.84P_2O_5*0.16B_2O_3): Eu^{2+}$, preferably $(2SrO*0.84P_2O_5*0.16B_2O_3): Eu^{2+}$;
c) $AD_8O_{13}:Eu^{2+}$, preferably $BaAl_8O_{13}:Eu^{2+}$;
d) $A_{10}(PO_4)_6Cl_2:Eu^{2+}$, preferably $(Sr,Mg,Ca)_{10}(PO_4)_6Cl_2:Eu^{2+}$; or
e) $A_2Si_3O_8*2ACl_2:Eu^{2+}$, preferably $Sr_2Si_3O_8*2SrCl_2:Eu^{2+}$. A method of making these phosphors is known in the art, as described on pages 389–432 of the *Phosphor Handbook*, Edited by S. Shionoya and W. M. Yen, CRC Press, (1987, 1999), incorporated herein by reference. For example, the SAE phosphor is prepared by mixing alpha alumina, europium oxide and strontium carbonate with a borate flux, firing the mixture at 1200° C. for several hours and subsequently cooling the mixture in forming gas (98% $N_2/2\% H_2$), pulverizing and sieving the calcined body, re-firing the resulting powder at 1300° C. in wet $H_2/N_2$ gas mixture and then re-pulverizing the re-fired body to form the second powder 4. The preferred composition of the SAE phosphor is $(Sr_{1-x}Eu_x)_4Al_{14}O_{25}$, where x ranges from 0.1 to 0.01, and having a preferred value of 0.1. A similar method may be used to form the $BaAl_8O_{13}:Eu^{2+}$ phosphor, with barium carbonate being used instead of strontium carbonate.

The starting materials for the $(2SrO*0.84P_2O_5*0.16B_2O_3): Eu^{2+}$ phosphor are $SrHPO_4$, $SrCO_3$, $Eu_2O_3$ and $H_3BO_3$ (99.5%). Firing is carried out at 1100 to 1250° C. in a slightly reducing atmosphere for several hours. The phosphor preferably contains 2 to 3 mol % of Eu. The starting materials for the $(Sr,Mg,Ca)_{10}(PO_4)_6Cl_2:Eu^{2+}$ phosphor are $BaHPO_4$, $BaCO_3$, $CaCO_3$, $MgO$, $NH_4Cl$ and $Eu_2O_3$. Firing is carried out at 800° C. in air and then, after re-pulverizing, in a slightly reducing atmosphere. The starting materials for the $Sr_2Si_3O_8*2SrCl_2:Eu^{2+}$ phosphor are $SrCO_3$, $SiO_2$ and $SrCl_2$ in a 2:3:2 ratio with 0.1 $Eu_2O_3$. The starting materials are mixed with water, fired at 850° C. in air for 3 hours, pulverized, re-fired at 950° C. in a slightly reducing atmosphere and re-pulverized. The re-pulverized calcined body is then washed with water to remove the remaining $SrCl_2$. However, any of the five second phosphor 4 powders may be commercially obtained, and thus, their exact method of manufacture is not significant.

The first 3 and second 4 phosphor powders are then blended or mixed together to form a phosphor powder blend or mixture. The powders 3, 4 may be manually blended in a crucible or mechanically blended in another suitable container, such as a ball mill. Of course, the phosphor powder blend may contain more than two powders, if desired. Alternatively, the first and second calcined bodies may be pulverized and blended together.

The composition of the phosphor powder blend may be optimized based on the composition of the first 3 and the second 4 phosphors and the peak emission wavelength of the radiation source 1. For example, for a radiation source having a peak emission wavelength of 405 nm, the phosphor powder blend preferably contains 89% by weight of $(Sr_{0.8}Eu_{0.1}Mn_{0.1})_2P_2O_7$ and 11% by weight of SAE. In contrast, for a radiation source having a peak emission wavelength of 380 nm, the phosphor powder blend preferably contains 77% by weight of $(Sr_{0.8}Eu_{0.1}Mn_{0.1})_2P_2O_7$ and 23% by weight of SAE.

The phosphor powder blend is then placed into the white light illumination system. For example, the phosphor powder blend may be placed over the LED chip, interspersed into the encapsulant material or coated onto the surface of the shell, as described above with respect to the first preferred embodiment of the present invention.

If the phosphor powder blend is coated onto the LED chip or the shell, then preferably, a suspension of the phosphor powder blend and a liquid is used to coat the LED chip or the shell surface. The suspension may also optionally contain a binder in a solvent. Preferably, the binder comprises an organic material, such as nitrocellulose or ethylcellulose, in a solvent such as butyl acetate or xylol. The binder enhances the adhesion of the powder particles to each other and to the LED or the shell. However, the binder may be omitted to simplify processing, if desired. After coating, the suspension is dried and may be heated to evaporate the binder. The phosphor powder blend acts as the phosphor layer 21 after drying the solvent.

If the phosphor blend is to be interspersed within the encapsulant material 19, then the phosphor blend may be added to a polymer precursor, and then the polymer precursor may be cured to solidify the polymer material. Alternatively, the phosphor blend may be mixed in with the epoxy encapsulant. Other phosphor interspersion methods may also be used.

If the phosphor blend is placed into a fluorescent lamp or a plasma display, then a suspension of the phosphor powder blend and a liquid is used to coat the lamp or plasma display interior surface. The suspension may also optionally contain a binder in a solvent, as described above.

While the phosphor coating method has been described as a coating of a phosphor blend, the first 3 and the second phosphors 4 may be formed as overlying, individual layers on a surface of the white light illumination system. Furthermore, the luminescent material(s) may comprise single crystal scintillator material(s) instead of or in addition to the phosphors, if desired. The scintillators may be made by any scintillator fabrication method. For example, the scintillators may be formed by Czochralski, float zone, or other crystal growing methods. The scintillators may then be placed over the LED chip or used as the shell or as a top portion of the shell of the white light illumination system.

The following examples are merely illustrative, and should not be construed to be any sort of limitation on the scope of the claimed invention.

EXAMPLE 1

A first $(Sr_{0.8}Eu_{0.1}Mn_{0.1})_2P_2O_7$ phosphor was prepared by blending $SrHPO_4$, $MnCO_3$, $Eu_2O_3$ and $(NH_4)HPO_4$ powders to form a starting powder mixture. The $(NH_4)HPO_4$ was added in an amount comprising 2% in excess of the stoichiometric ratio per mole of the first phosphor produced. The starting powder mixture was then heated in air at about 600° C. for 1 hour. The resulting powder was then re-blended and subsequently fired in a reducing atmosphere comprising nitrogen and 0.5% hydrogen at about 1000° C. for eight hours to form a calcined phosphor body or cake. The solid phosphor cake was converted to a first phosphor powder by wet milling and subsequent drying.

The first phosphor powder was blended with a commercially obtained SAE phosphor powder in a ratio of 89:11 by weight to obtain a phosphor powder blend or mixture. The phosphor powder blend was irradiated with a light source having a peak emission wavelength of 405 nm. The phosphor emission appeared white and its CIE color coordinates were determined to be x=0.39 and y=0.42 from photometric calculations. The color coordinates are indicative of a color output which appears white to a human observer.

EXAMPLE 2

The experiment of Example 1 was repeated, except that a radiation source had a peak emission wavelength of 380 nm and the phosphor powder blend contained a 77:23 ratio by weight of strontium pyrophosphate to SAE. The phosphor emission appeared white and its CIE color coordinates were determined to be x=0.39 and y=0.42 from photometric calculations. The color coordinates are indicative of a color output which appears white to a human observer.

The preferred embodiments have been set forth herein for the purpose of illustration. However, this description should not be deemed to be a limitation on the scope of the invention. Accordingly, various modifications, adaptations, and alternatives may occur to one skilled in the art without departing from the spirit and scope of the claimed inventive concept.

What is claimed is:

1. A white light illumination system comprising:

a radiation source;

a first luminescent material having a peak emission wavelength of about 570 to about 620 nm, the first luminescent material comprising a first $APO:Eu^{2+},Mn^{2+}$ phosphor; and a second luminescent material having a peak emission wavelength of about 480 to about 500 nm, which is different from the first luminescent material, wherein A comprises at least one of Sr, Ca, Ba or Mg.

2. The system of claim 1, wherein the first phosphor comprises $A_2P_2O_7:Eu^{2+},Mn^{2+}$.

3. The system of claim 2, wherein:

the first phosphor comprises $(A_{1-x-y}Eu_xMn_y)_2P_2O_7$;

$0<x\leqq0.2$; and $0<y\leqq0.2$.

4. The system of claim 3, wherein the second luminescent material comprises a second phosphor selected from at least one of:

a) $A_4D_{14}O_{25}:Eu^{2+}$, where A comprises at least one of Sr, Ca, Ba or Mg, and D comprises at least one of Al or Ga;

b) $(2AO*0.84P_2O_5*0.16B_2O_3): Eu^{2+}$, where A comprises at least one of Sr, Ca, Ba or Mg;

c) $AD_8O_{13}:Eu^{2+}$, where A comprises at least one of Sr, Ca, Ba or Mg, and D comprises at least one of Al or Ga;

d) $A_{10}(PO_4)_6Cl_2:Eu^{2+}$, where A comprises at least one of Sr, Ca, Ba or Mg; or e) $A_2Si_3O_8*2ACl_2:Eu^{2+}$, where A comprises at least one of Sr, Ca, Ba or Mg.

5. The system of claim 4, wherein the second luminescent material comprises a second phosphor selected from at least one of:

a) a $Sr_4Al_{14}O_{25}:Eu^{2+}$ phosphor;

b) a $(2SrO*0.84P_2O_5*0.16B_2O_3): Eu^{2+}$ phosphor;

c) a $BaAl_8O_{13}:Eu^{2+}$ phosphor;

d) a $(Sr,Mg,Ca)_{10}(PO_4)_6Cl_2:Eu^{2+}$ phosphor; or e) a $Sr_2Si_3O_8*2SrCl_2:Eu^{2+}$ phosphor.

6. The system of claim 5, wherein the first phosphor and the second phosphor are interspersed.

7. The system of claim 6, wherein the light source comprises a light emitting diode having a peak emission wavelength of between 370 and 405 nm.

8. The system of claim 7, further comprising:

a shell containing the light emitting diode;

an encapsulating material between the shell and the light emitting diode;

and wherein:

a) the first and second phosphors are coated over a surface of the light emitting diode;

b) the first and second phosphors are interspersed in the encapsulating material; or c) the first and second phosphors are coated onto the shell.

9. The system of claim 8, wherein:

the first phosphor comprises $(Sr_{0.8}Eu_{0.1}Mn_{0.1})_2P_2O_7$;

the second phosphor comprises $(Sr_{0.90-0.99}Eu_{0.01-0.1})_4Al_{14}O_{25}$;

the light emitting diode peak emission wavelength is about 380 nm;

a ratio by weight of the first phosphor to the second phosphor is about 77:23; and CIE color coordinates of a radiation emitted by the system is about x=0.39 and y=0.42.

10. The system of claim 8, wherein:

the first phosphor comprises $(Sr_{0.8}Eu_{0.1}Mn_{0.1})_2P_2O_7$;

the second phosphor comprises $(Sr_{0.90-0.99}Eu_{0.01-0.1})_4Al_{14}O_{25}$;

the light emitting diode peak emission wavelength is about 405 nm;

the ratio by weight of the first phosphor to the second phosphor is about 89:11; and CIE color coordinates of a radiation emitted by the system is about x=0.39 and y=0.42.

11. A white light illumination system comprising:

a light emitting diode having a peak emission wavelength between 370 and 405 nm;

a first APO:$Eu^{2+}$,$Mn^{2+}$ phosphor, where A comprises at least one of Sr, Ca, Ba or Mg; and a second phosphor selected from at least one of:
  a) $A_4D_{14}O_{25}$:$Eu^{2+}$, where A comprises at least one of Sr, Ca, Ba or Mg, and D comprises at least one of Al or Ga;
  b) $(2AO*0.84P_2O_5*0.16B_2O_3)$: $Eu^{2+}$, where A comprises at least one of Sr, Ca, Ba or Mg;
  c) $AD_8O_{13}$:$Eu^{2+}$, where A comprises at least one of Sr, Ca, Ba or Mg, and D comprises at least one of Al or Ga;
  d) $A_{10}(PO_4)_6Cl_2$:$Eu^{2+}$, where A comprises at least one of Sr, Ca, Ba or Mg; or
  e) $A_2Si_3O_8*2ACl_2$:$Eu^{2+}$, where A comprises at least one of Sr, Ca, Ba or Mg.

12. The system of claim 11, wherein:

the first phosphor comprises $(A_{1-x-y}Eu_xMn_y)_2P_2O_7$, where $0<x\leq0.2$; and $0<y<0.2$;

the second phosphor is selected from at least one of:
  a) a $Sr_4Al_{14}O_{25}$:$Eu^{2+}$ phosphor;
  b) a $(2SrO*0.84P_2O_5*0.16B_2O_3)$: $Eu^{2+}$ phosphor;
  c) a $BaAl_8O_{13}$:$Eu^{2+}$ phosphor;
  d) a $(Sr,Mg,Ca)_{10}(PO_4)_6Cl_2$:$Eu^{2+}$ phosphor; or
  e) a $Sr_2Si_3O_8*2SrCl_2$:$Eu^{2+}$ phosphor; and the first phosphor is interspersed with the second phosphor.

13. The system of claim 12, further comprising:

a shell containing the light emitting diode;

an encapsulating material between the shell and the light emitting diode;

and wherein:
  a) the first and second phosphors are coated over a surface of the light emitting diode;
  b) the first and second phosphors are interspersed in the encapsulating material; or
  c) the first and second phosphors are coated onto the shell.

14. The system of claim 13, wherein:

the first phosphor comprises $(Sr_{0.8}Eu_{0.1}Mn_{0.1})_2P_2O_7$;

the second phosphor comprises $(Sr_{0.90-0.99}Eu_{0.01-0.1})_4Al_{14}O_{25}$;

CIE color coordinates of a radiation emitted by the system is about x=0.39 and y=0.42; and the light emitting diode peak emission wavelength and a ratio by weight of the first phosphor to the second phosphor satisfy one of the following relationships:
  a) the light emitting diode peak emission wavelength is about 380 nm and a ratio by weight of the first phosphor to the second phosphor is about 77:23; or
  b) the light emitting diode peak emission wavelength is about 405 nm and a ratio by weight of the first phosphor to the second phosphor is about 89:11.

* * * * *

UNITED STATES PATENT AND TRADEMARK OFFICE
CERTIFICATE OF CORRECTION

PATENT NO.    : 6,501,100 B1
DATED         : December 31, 2002
INVENTOR(S)   : Alok Mani Srivastava et al.

Page 1 of 1

It is certified that error appears in the above-identified patent and that said Letters Patent is hereby corrected as shown below:

<u>Column 1,</u>
Immediately following the title and before the heading "BACKGROUND OF THE INVENTION", insert the following heading and paragraph,
-- STATEMENT REGARDING FEDERALLY SPONSORED RESEARCH OR DEVELOPMENT
    The U.S. Government may have certain rights in this invention pursuant to grant number 70NANB8H4022 from the NIST. --

Signed and Sealed this

Fourth Day of March, 2003

JAMES E. ROGAN
*Director of the United States Patent and Trademark Office*